(12) United States Patent
Nagumo et al.

(10) Patent No.: US 9,866,195 B2
(45) Date of Patent: Jan. 9, 2018

(54) ANTENNA DEVICE

(71) Applicant: MURATA MANUFACTURING CO., LTD., Kyoto (JP)

(72) Inventors: Shoji Nagumo, Kyoto (JP); Masashi Nakazato, Kyoto (JP); Motoyasu Nakao, Kyoto (JP); Yuji Shintomi, Kyoto (JP)

(73) Assignee: Murata Manufacturing Co., Ltd., Kyoto-Fu (JP)

( * ) Notice: Subject to any disclaimer, the term of this patent is extended or adjusted under 35 U.S.C. 154(b) by 0 days.

(21) Appl. No.: 15/646,774

(22) Filed: Jul. 11, 2017

(65) Prior Publication Data

US 2017/0310298 A1   Oct. 26, 2017

Related U.S. Application Data

(63) Continuation of application No. 14/331,625, filed on Jul. 15, 2014, now Pat. No. 9,748,917, which is a
(Continued)

(30) Foreign Application Priority Data

Mar. 5, 2012   (JP) .................................. 2012-047550

(51) Int. Cl.
*H01Q 9/42*   (2006.01)
*H03H 7/40*   (2006.01)
(Continued)

(52) U.S. Cl.
CPC .............. *H03H 7/40* (2013.01); *H01Q 1/243* (2013.01); *H01Q 1/50* (2013.01); *H01Q 5/335* (2015.01); *H01Q 9/42* (2013.01)

(58) Field of Classification Search
CPC .......... H01Q 5/335; H01Q 1/243; H01Q 1/50; H01Q 9/42; H03H 7/40
See application file for complete search history.

(56) References Cited

U.S. PATENT DOCUMENTS

| 2,653,228 | A | 9/1953 | Wen |
| 2010/0001889 | A1 | 1/2010 | Bartling et al. |
| 2012/0154245 | A1 | 6/2012 | Nagumo et al. |

FOREIGN PATENT DOCUMENTS

| CN | 101968514 A | 2/2011 |
| JP | H07-65261 A | 3/1995 |

(Continued)

OTHER PUBLICATIONS

International Search Report; PCT/JP2013/053308; dated May 14, 2013.
(Continued)

*Primary Examiner* — Graham Smith
*Assistant Examiner* — Noel Maldonado
(74) *Attorney, Agent, or Firm* — Studebaker & Brackett PC

(57) ABSTRACT

A stray capacitance is generated between an antenna element and a ground electrode. A capacitance detection circuit detects the stray capacitance. An antenna matching circuit, is provided along a wireless communication signal path, which is a transmission path between the antenna element and a feeder circuit. A feedback control circuit transmits a control signal to the variable matching circuit on the basis of a detection result of the capacitance detection circuit in accordance with the stray capacitance. The capacitance detection circuit includes a constant current source and a timing circuit to measure the time taken to charge the antenna from the constant current source and for the voltage to reach a predetermined voltage.

7 Claims, 9 Drawing Sheets

Related U.S. Application Data continuation of application No. PCT/JP2013/053308, filed on Feb. 13, 2013.

(51) Int. Cl.
   *H01Q 1/24* (2006.01)
   *H01Q 5/335* (2015.01)
   *H01Q 1/50* (2006.01)

(56) References Cited

FOREIGN PATENT DOCUMENTS

| JP | H11-30842 A | 2/1999 |
| JP | 2000-286924 A | 10/2000 |
| JP | 2011-113506 A | 6/2011 |
| WO | 2011/024506 A1 | 3/2011 |

OTHER PUBLICATIONS

Written Opinion of the International Searching Authority; PCT/JP2013/053308; dated May 14, 2013.

An Office Action; "Notice on the First Office Action," issued by the State Intellectual Property Office of the People's Republic of China on May 25, 2015, which corresponds to Chinese Patent Application No. 201380011469.9 and is related to U.S. Appl. No. 14/331,625; with English language translation.

US 9,866,195 B2

1

ANTENNA DEVICE

CROSS REFERENCE TO RELATED APPLICATIONS

The present application is a continuation of U.S. patent application Ser. No. 14/331,625 filed Jul. 15, 2014, which is a continuation of International Application No. PCT/JP2013/053308 filed Feb. 13, 2013, and claims priority to Japanese Patent Application 2012-047550 filed Mar. 5, 2012, the entire content of each of which are incorporated herein by reference.

TECHNICAL FIELD

The present technical field relates to antenna devices provided in, for example, cellular phone terminals.

BACKGROUND

In International Publication No. 2011/024506, there is disclosed an antenna device in which antenna matching that has deviated due to the influence of the surroundings, such as there being a human body nearby, is corrected each time such deviation occurs.

FIGS. 13(A) and 13(B) show a configuration diagram of the antenna device described in International Publication No. 2011/024506. FIG. 13(A) is a configuration diagram of the entirety of the antenna device and FIG. 13(B) illustrates the basic form of a capacitance-voltage conversion circuit.

In FIG. 13(A), a variable matching circuit 30 is provided along a wireless communication signal path, which is a transmission path between an antenna element 21 and a feeder circuit 40. A capacitance detection circuit 60 forms a capacitance-voltage conversion circuit (C-V conversion circuit) that converts a change in stray capacitance generated by the nearness of a human body into a change in voltage and then outputs the change in voltage. A feedback control circuit 70 supplies a control signal to the variable matching circuit 30 on the basis of the voltage output from the capacitance detection circuit 60.

In FIG. 13(B), a local oscillator OSC is connected in series with a detection target capacitance Cs. A reference potential Vref1 is applied to a non-inverting input terminal of an operational amplifier OP. Consequently, a potential at a connection point P5 between the detection target capacitance Cs and a feedback capacitance Cf (input voltage of operational amplifier OP) is a potential corresponding to the detection target capacitance. Compared with the frequency band of a wireless communication signal, an oscillation frequency of the local oscillator OSC is a low frequency that is almost the same as that of a direct current.

SUMMARY

Technical Problem

In the capacitance detection circuit 60 illustrated in FIG. 13(B), a signal of a voltage divided between the antenna equivalent capacitance Cs and the feedback capacitance Cf is amplified and therefore point P5 in FIG. 13(B) is floating in terms of direct current. Consequently, a very low frequency signal needs to be generated in the local oscillator OSC in order to determine the voltage. However, there is a risk of this very low frequency signal traveling to the high frequency circuit side, becoming a source of noise for wireless communication and causing degradation of com-

2 munication quality. In addition, there are many very low frequency noises in the surrounding environment and therefore there is a risk of the accuracy with which a capacitance is measured being reduced by the effect of such external low frequency noise when capacitance detection is being performed. In addition, circuit variations naturally occur in operational amplifier blocks that amplify a minute signal and noise is amplified, and therefore circuit integration is difficult.

Consequently, an object of the present disclosure is to provide an antenna device that detects the surrounding environment which causes the antenna characteristics to change, appropriately corrects the antenna characteristics and always maintains stable antenna characteristics while solving problems due to the use of very low frequency signals and problems due to the influence of environmental noise and small signal amplification.

Solution to Problem

In order to solve the above-described problems, the following configurations are adopted in the present disclosure.

(1) An antenna device includes an antenna element, an antenna matching circuit connected between the antenna element and a feeder unit, a capacitance detection circuit that is connected to the antenna element and detects a stray capacitance of the antenna element and a feedback control circuit that controls the antenna matching circuit in accordance with an output signal of the capacitance detection circuit. The capacitance detection circuit includes a constant current source and timing means that measures a time taken to charge an antenna from the constant current source and for a voltage to reach a predetermined voltage.

With the above-described configuration, since there is no need to use a very low frequency signal, it is not likely to have an effect due to environmental noise and circuit integration is facilitated.

(2) It is preferable that the antenna device further include a reactance element (Cp) that is connected to a wireless communication signal path, which is a transmission path between the antenna element and the antenna matching circuit, that allows a wireless communication signal to pass therethrough and that blocks a direct current, and a reactance element (Ls) that is shunt-connected to the wireless communication signal path between the antenna matching circuit and the reactance element (Cp).

With this configuration, by supplying a ground potential to the reactance element (Cp), measurement of capacitance by performing charging from the constant current source can be applied to measurement of a stray capacitance of the antenna and the reactance element (Cp) can coexist with the antenna matching circuit.

(3) A configuration may be adopted that further includes a reactance element (Cp) that is connected to a wireless communication signal path, which is a transmission path between the antenna element and the antenna matching circuit, that allows a wireless communication signal to pass therethrough and that blocks a direct current, and in which the antenna matching circuit includes a reactance element (L1) that is shunt-connected.

(4) It is preferable that the antenna matching circuit include a variable capacitance element (Cv) that is connected in series with the wireless communication signal path, and an inductor (Lp) that is connected in parallel with the variable capacitance element.

With this configuration, even when the configuration is such that the variable capacitance element (Cv) is inserted directly below the antenna that can vary a series reactance, that is, even when the antenna matching circuit is a variable matching circuit, measurement of the stray capacitance of the antenna can be performed and the variable reactance element (Cv) can coexist with the antenna matching circuit.

(5) It is preferable that a filter circuit (reactance element Lb or low pass filter) that blocks a wireless communication signal supplied to the antenna element or transmitted from the antenna element be provided along the transmission path between the antenna element and the capacitance detection circuit (sensing signal path).

With this configuration, capacitance detection can be performed without being influenced by a wireless communication signal.

(6) It is preferable that the capacitance detection circuit and the feedback control circuit be formed by a single application specific integrated circuit (ASIC).

With this configuration, an antenna device can be formed that is compact with few variations in characteristics.

(7) Among a plurality of types of antenna elements (pseudo dipole formed of an antenna element not included in a matching circuit [including a load reactance in a desired frequency band] and a substrate ground electrode) that are capable of being connected to an antenna connection portion of the antenna matching circuit, the antenna element is an antenna element that has good radiation Q in an integrated body that includes the antenna element.

With this configuration, an antenna having good radiation Q is connected to the antenna matching circuit and as a result an antenna device having high efficiency can be formed.

(8) Selection conditions for the plurality of types of antenna elements include a position of a feeding point for the antenna element, and a position of connection of the capacitance detection circuit to the antenna element.

Thus, an antenna element having good radiation Q can be easily selected with certainty and an antenna device having high efficiency can be formed.

Advantageous Effects of Disclosure

According to the present disclosure, there is no need to use a very low frequency signal since it is not likely to have an effect due to environmental noise and circuit integration is facilitated.

BRIEF DESCRIPTION OF THE DRAWINGS

FIG. 13(A) is a configuration diagram of the entire antenna device and FIG. 13(B) illustrates a basic form of a capacitance-voltage conversion circuit.

DETAILED DESCRIPTION

First Embodiment

An antenna device according to a first embodiment will be described with reference to FIGS. 1 to 7.

Figure 1A:
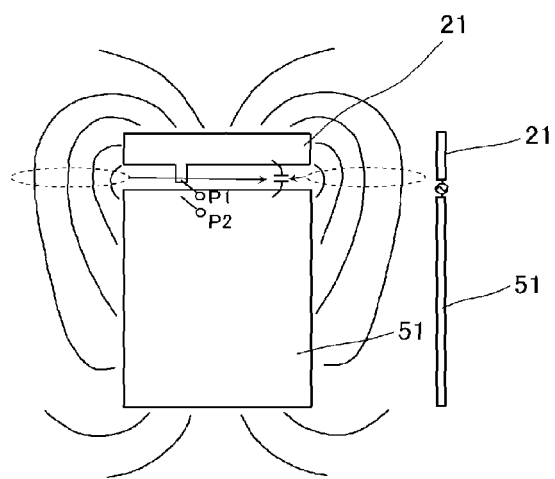
FIG. 1(A) schematically illustrates with lines of electric force an electric field formed between an antenna element 21 and a substrate ground electrode 51.

An electric field is formed between an antenna element 21 and a substrate ground electrode 51 as schematically illustrated by lines of electric force in FIG. 1(A). Electromagnetic waves are radiated to the outside as a result of the electric field alternating at a high frequency as in a wireless communication signal. A so-called electrostatic field is formed by a direct current.

On the right-hand side of FIG. 1(A), a pseudo-dipole formed by the antenna element 21 and the substrate ground electrode 51 is illustrated.

The antenna element 21 and the substrate ground electrode 51 can be regarded as the opposing conductors of a capacitor connected by the lines of electric force and the capacitance of this capacitor determines the resonant frequency and is a so-called stray capacitance.

Figure 1B:
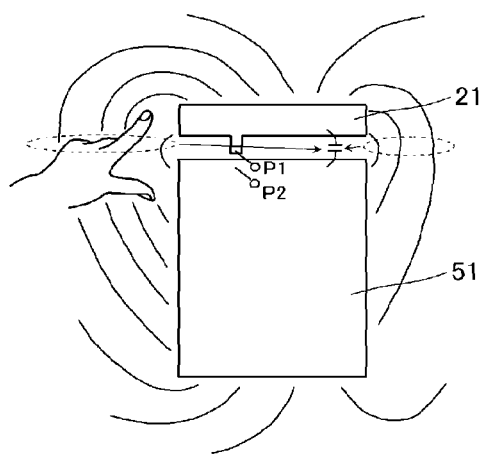
FIG. 1(B) illustrates a state in which part of a human body is near the antenna device.

FIG. 1(B) illustrates a state in which part of a human body has come close to the antenna device. When part of a human body (palm or finger) enters the electric field in this way, the lines of electric force are incident (terminated) so as to be drawn toward the human body (since a human body is a high resistivity dielectric) and the capacitance (stray capacitance) between the antenna element 21 and the substrate ground electrode 51 (between terminals P1 and P2 in FIG. 1(B)) is increased. This is equivalent to a state in which a dielectric has been inserted between the capacitor electrodes.

Thus, there is a close relationship between the degree of nearness of a human body and the change in stray capacitance. This relationship is used to sense the nearness of a human body and an antenna element is used for two functions of transmitting/receiving electromagnetic waves of a wireless communication signal and detecting the nearness of a human body (doubles up).

Figure 2:
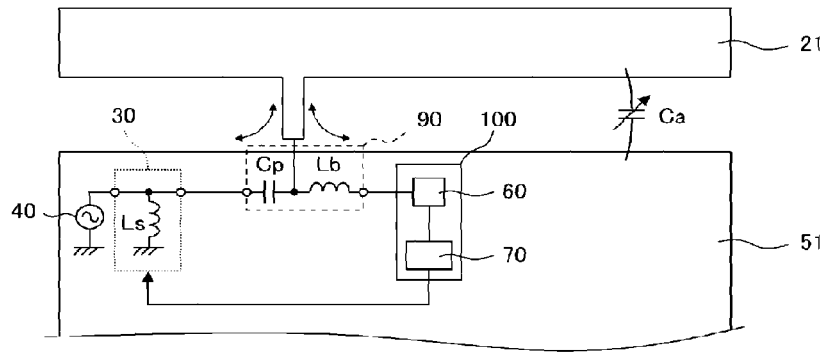
FIG. 2 illustrates a configuration of an antenna device equipped with a capacitance detection circuit 60 that detects a stray capacitance or a change in stray capacitance.

FIG. 2 illustrates a configuration of an antenna device equipped with a capacitance detection circuit 60 that detects a stray capacitance or a change in stray capacitance.

In FIG. 2, a stray capacitance Ca is generated between the antenna element 21 and the ground electrode 51. The capacitance detection circuit 60 detects this stray capacitance Ca. A variable matching circuit 30, which is an antenna matching circuit, is provided along a wireless communication signal path, which is a transmission path, between the antenna element 21 and a feeder circuit 40. The variable matching circuit 30 is a reconfigurable matching circuit that performs matching for two frequency bands, that is, a low band and a high band. A feedback control circuit 70 supplies a control signal to the variable matching circuit 30 on the basis of a detection result of the capacitance detection circuit 60, that is, in accordance with the stray capacitance Ca.

In addition, a capacitor (reactance element) Cp is provided along the wireless communication signal path, which is a transmission path between the antenna element 21 and the variable matching circuit 30. This capacitor Cp allows a wireless communication signal to pass but blocks a direct current. In addition, an inductor (reactance element) Lb is provided along a sensing signal path, which is a transmission path between the antenna element 21 and the capacitance detection circuit 60. This inductor Lb blocks a wireless communication signal supplied to the antenna element 21 or transmitted from the antenna element 21. In addition, an inductor Ls is shunt-connected to the wireless communication signal path between the variable matching circuit 30 and the capacitor Cp. The inductor Ls provides a ground potential to the capacitor Cp. As will be described below, with this configuration, capacitance detection can be performed by the capacitance detection circuit 60.

In FIG. 2, the capacitance detection circuit 60 and the feedback control circuit 70 are formed by an application specific integrated circuit (ASIC) 100.

Figure 3:
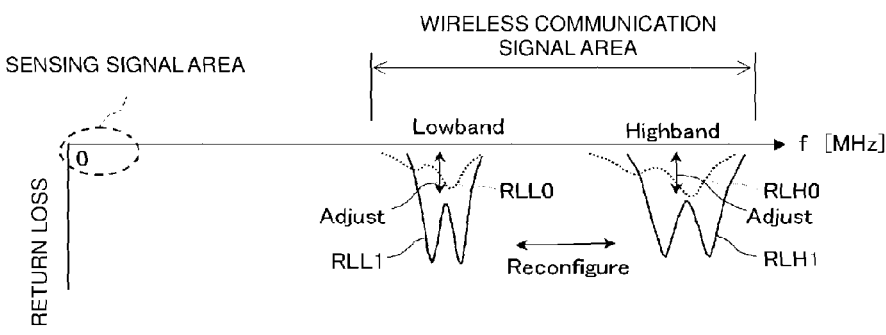
FIG. 3 illustrates operations of the capacitance detection circuit 60, a feedback control circuit 70 and a variable matching circuit 30.

FIG. 3 illustrates operations of the capacitance detection circuit 60, the feedback control circuit 70 and the variable matching circuit 30. In FIG. 3, the horizontal axis represents frequency and the vertical axis represents return loss. This example concerns an antenna device that performs communication in either of two frequency bands that are a low band and a high band, and a low-frequency signal having a frequency of zero (electrostatic field) or a frequency in the vicinity of zero is used to detect a stray capacitance.

When a human body comes near to the antenna device and the stray capacitance changes (increases), antenna matching in the low band and the high band attempts to enter an unmatched state (return loss is degraded). However, the capacitance detection circuit 60 outputs a voltage corresponding to the increase in the stray capacitance and the feedback control circuit 70 supplies a control voltage corresponding to the increase in the stray capacitance to the variable matching circuit 30. Thus, the circuit constant of the variable matching circuit 30 is changed and the variable matching circuit 30 returns to an appropriate matching state (appropriate matching state is maintained).

In FIG. 3, a low-band return loss wave form RLL0 is adjusted to a return loss wave form RLL1 by appropriate matching and similarly a high-band return loss wave form RLH0 is adjusted to a return loss waveform RLH1 by appropriate matching.

Figure 4:
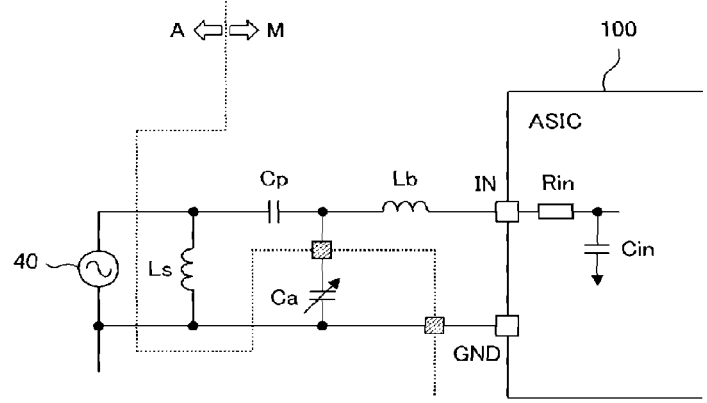
FIG. 4 is an equivalent circuit diagram of a main portion of the antenna device illustrated in FIG. 2.

FIG. 4 is an equivalent circuit diagram of a main portion of the antenna device illustrated in FIG. 2. The same symbols are used to denote the same elements in FIG. 4 and FIG. 2. The ASIC 100 detects a capacitance between an IN terminal and a GND terminal. An input resistance Rin and an input capacitance Cin inside the ASIC 100 form a low pass filter. Input of a wireless communication signal is blocked by the low pass filter. In addition, a constant current circuit and a comparator as will be described below are connected inside the ASIC 100.

In FIG. 4, a circuit section not including the feeder circuit 40 and the stray capacitance Ca is an ASIC-equipped module "M" that performs capacitance detection and the feeder circuit 40 and the stray capacitance Ca are included in a circuit "A" of a terminal into which the ASIC-equipped module is incorporated.

Figure 5:
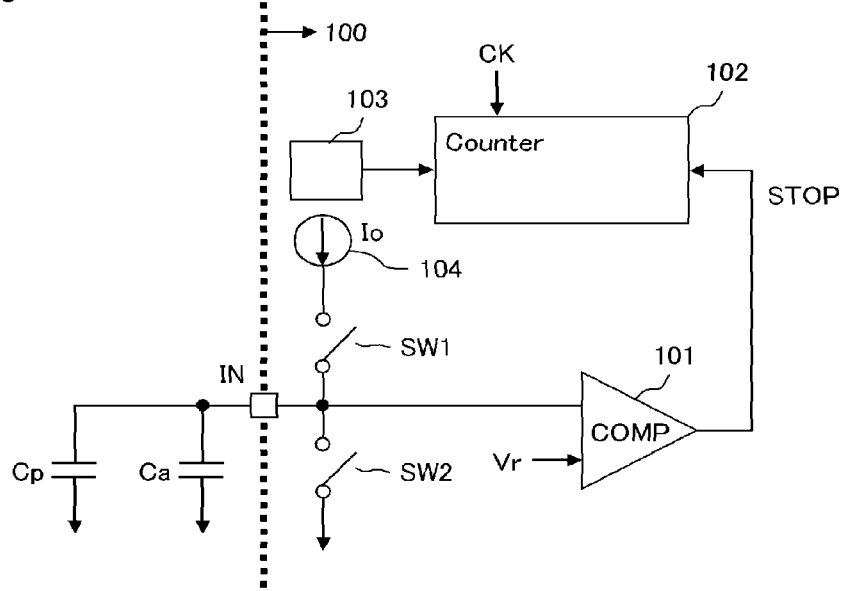
FIG. 5 illustrates a configuration of a capacitance detection circuit within an ASIC.

FIG. 5 illustrates a configuration of a capacitance detection circuit within the ASIC. As illustrated in FIG. 4, since the inductor Ls is shunt-connected close to the feeder circuit 40 of the capacitor Cp, the capacitor Cp and the stray capacitance Ca are equivalently connected in parallel with each other (in terms of direct current) outside of the IN terminal of the ASIC. A voltage of the IN terminal is input to a comparator 101 inside the ASIC 100. A first terminal of a switch SW1 and a first terminal of a switch SW2 are connected to an input portion (IN terminal) of the comparator 101. A constant current source 104 is connected to a second terminal of the switch SW1 and a second terminal of the switch SW2 is connected to the ground potential. A reference voltage Vr is input to a reference input portion of the comparator 101. The comparator 101 supplies a STOP signal to a counter 102. A trigger circuit 103 supplies a START signal to the counter 102. The counter 102 starts counting a clock signal CK after the START signal becomes effective (is asserted) and stops counting when the STOP signal becomes effective (is asserted).

A switch control circuit that supplies control signals to the switches SW1 and SW2 is provided in the ASIC 100. This switch control circuit turns the switch SW1 on and the switch SW2 off when a START signal generated by the trigger circuit 103 becomes effective, and turns the switch SW1 off and the switch SW2 on when the output of the comparator 101 is inverted.

In addition, in the ASIC 100, the feedback control circuit 70 is formed that controls the trigger circuit 103 and reads out the count value of the counter 102 and outputs a control voltage to the variable matching circuit (30) in accordance with the count value.

There is a relationship $Q=CV$ between charge Q, capacitance C and charging voltage V and the time differential thereof is $i=dQ/dt=CdV/dt$. When a capacitor (Ca+Cp) is charged from the constant current source the IN terminal voltage Vin increases in proportion to time T. Ca can be calculated from the difference between the time T taken for V to reach Vr in the case where $C=Ca+Cp$ and that in the case where $C=Cp$ (already known).

On a module jig or the like, an increase $\Delta T$ ($=\Delta Tk$) in time T in a case in which the stray capacitance Ca of the antenna element 21 is taken as 0 and a capacitor having a known capacitance Ck is connected instead of the stray capacitance Ca of the antenna element 21 is measured and from the relation $\Delta Tk:\Delta T=Ck:Ca$, the stray capacitance Ca of the antenna element 21 is calculated.

Figure 6:
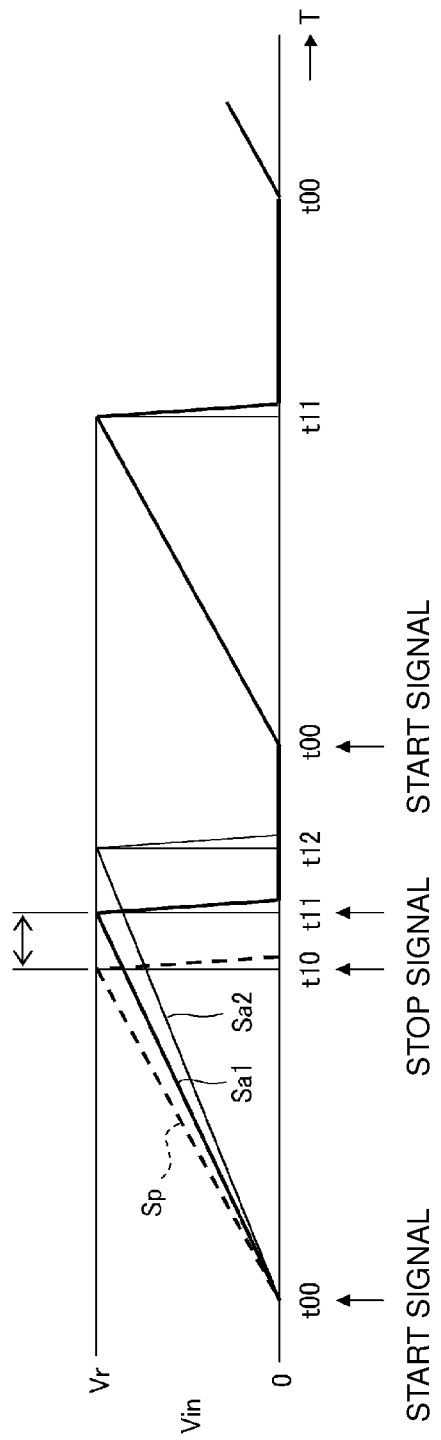
FIG. 6 illustrates voltage transitions at an IN terminal.

Next, a concrete example of this will be described. FIG. 6 illustrates voltage transitions at the IN terminal. In FIG. 6, once the START signal becomes effective (is asserted) at timing t00, the switch SW1 is turned on and the switch SW2 is turned off and therefore charging of the parallel connection circuit of the capacitors Cp and Ca illustrated in FIG. 5 by the constant current source 104 is started. Then, the voltage Vin of the IN terminal rises with a slope Sa1 corresponding to the combined capacitance of the capacitors Cp and Ca. When Vin reaches the reference voltage Vr at timing t11, the output of the comparator 101 is inverted, the STOP signal becomes effective and the counter 102 stops counting. Along with the STOP signal becoming effective, the switch SW1 is turned off and the switch SW2 is turned on, the capacitors Cp and Ca are discharged and Vin rapidly becomes 0.

As illustrated in FIG. 6, supposing that the stray capacitance Ca is 0, Vin rises with the slope Sp and counting is stopped at timing t10. Therefore, the difference between a count value at t10 and a count value at t11 corresponds to the stray capacitance Ca of the antenna element. If the stray capacitance Ca is increased, the timing at which Vin reaches Vr is delayed as illustrated by T12 and the count value of the counter 102 is increased. In this way, a value that corresponds to the stray capacitance Ca of the antenna element is obtained from the value of the counter.

The feedback control circuit 70 obtains a control signal (voltage) to be supplied to the variable matching circuit that corresponds to a capacitance of the stray capacitance Ca of the antenna element by referring to table data as illustrated in the following table 1.

TABLE 1

| | Lowband | | | Highband | |
|---|---|---|---|---|---|
| | CONTROL SIGNAL | | | CONTROL SIGNAL | |
| Ca[pF] | Channel 1 | Channel 2 | Ca[pF] | Channel 1 | Channel 2 |
| C3 | SPI1e | SPI2e | C3 | ... | ... |
| C2 | SPI1d | SPI2d | C2 | ... | ... |
| C1 | SPI1b | SPI2c | C1 | ... | ... |
| C0 | SPI1b | SPI2b | C0 | ... | ... |
| | SPI1a | SPI2a | | ... | ... |

Here, the variable matching circuit includes two variable capacitance elements. As illustrated in Table 1, there are a plurality of tables corresponding to the communication bands. Each table is constructed such that a control value related to a variable capacitance element for rough adjustment (Channel 1) and a control value related to a variable capacitance value for fine adjustment (Channel 2) are read out on the basis of a threshold of the stray capacitance Ca of the antenna element. Of course, the number of variable capacitance elements provided in the variable matching circuit is not limited to two.

The variable capacitance elements of the variable matching circuit are elements whose capacitances are determined by input of digital value. The feedback control circuit 70 selects a table in accordance with communication system information from the terminal and supplies values of Channel 1 and Channel 2 read out from the tables to the variable capacitance element for rough adjustment and the variable capacitance element for fine adjustment.

Figure 7A:
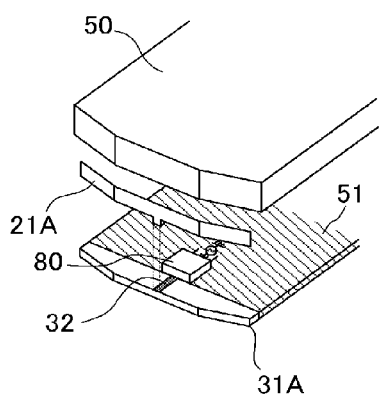
FIGS. 7(A) and 7(B) are exploded perspective views illustrating the specific structures of two antenna devices.
Figure 7B:
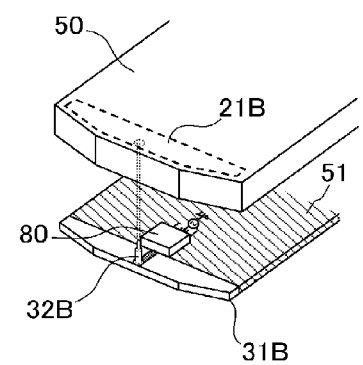

FIGS. 7(A) and 7(B) are exploded perspective views illustrating the specific structures of two antenna devices. It is possible that it will be necessary to perform connection at interfaces of connect spring terminals or contact pins due to the three dimensionality of the arrangement of constituent components of the antenna devices and examples of this are illustrated in FIG. 7(A) and FIG. 7(B).

In the example of FIG. 7(A), an antenna element 21A formed by subjecting a metal plate to bending processing is employed and the antenna element 21A is soldered to or is made to spring contact an antenna connection portion 32 formed on a substrate 31A, and the upper side thereof is covered with a casing 50. An end portion of each of the antenna element 21A and the substrate 31A is formed so as to match the shape of the casing 50 with there being no wasted space therebetween. In this example, an antenna matching module 80 formed by integrating the capacitance detection circuit 60, the feedback control circuit 70 and the variable matching circuit 30 into a module is mounted on the substrate 31A.

In the example of FIG. 7(B), a pin-shaped antenna connection portion 32B is attached to a substrate 31B, an antenna element 21B is provided on an inner surface of a casing 50, and the antenna connection portion 32B is spring connected to the antenna element 21B in a state where the substrate 31B is covered by the casing 50. Thus, the present disclosure can be applied in situations where an antenna element is provided in part of a casing.

Furthermore, the antenna element may be directly formed in a non-ground region of a substrate or the antenna element may be formed on the side of a substrate.

The present disclosure can be applied regardless of whether the arrangement position of the antenna element is within a region of the substrate in which the ground electrode is formed or outside of a region of the substrate in which the ground electrode is formed (region in which ground electrode is not formed).

In addition, in the above-described example, an antenna element is realized as a plane plate but patterning may be performed. A frequency band used in sensing is practically zero (direct current) and therefore even if the antenna element is subjected to tuning patterning, the antenna element will only operate as the opposing conductor of the stray capacitance in the frequency band used in sensing.

Regarding patterning of the antenna element, for example, a pattern may be formed such that it resonates at both a fundamental and a harmonic frequency by forming a slit and realizing a branching shape; a pattern may be formed such that there is a resonant point in a plurality of bands by inserting a reactance element into the antenna element; and a pattern may be formed that is divided into a feed element and a passive element.

The capacitance detection circuit can be connected to a wide range of targets such as passive elements, diversity antennas and antennas for frequency bands of different systems (for example Bluetooth (registered trademark) and WLAN antennas).

In addition, although an example has been described in which the variable matching circuit has two sets of broad band resonance characteristics in two frequency bands and adjusts matching in accordance with the surrounding environment, the present disclosure is not limited to this example. For example, the present disclosure may be applied to (1) a circuit that that has one set of resonant characteristics, (2) a circuit that includes a variable reactance element in a π type or T type circuit configuration (reconfiguration is not considered), or (3) a configuration in which a plurality of matching circuits are prepared in advance and the matching circuits are switched between through path selection in accordance with the degree of nearness of a human body.

In addition, the target of reconfiguration is not limited to cases of a low band [for example, 800/900 MHz GSM (Registered Trademark)] and a high band [for example, DCS, PCS and UMTS]. Other systems (such as WLAN/Bluetooth (Registered Trademark)/WiMax (Registered Trademark)) may also be covered and a case is also possible in which five bands (Pentaband) are covered with a finer division (at such a time, the prepared capacitance values are finely set).

Second Embodiment

Figure 8:
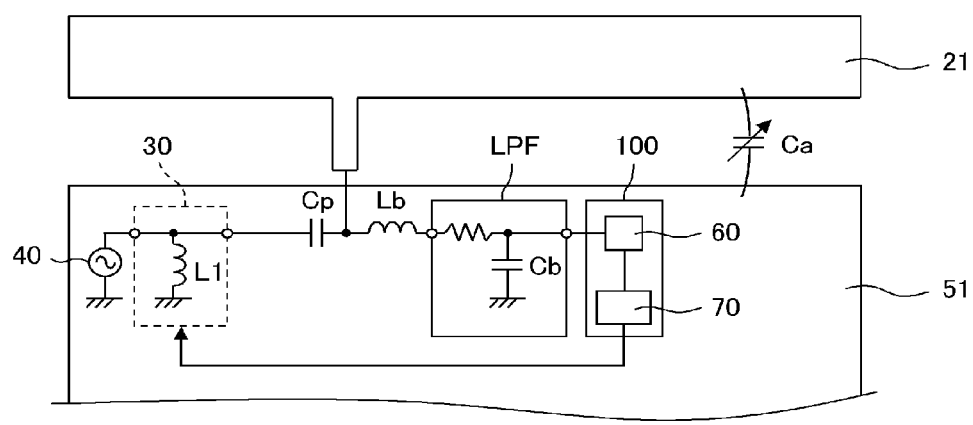
FIG. 8 illustrates the configuration of an antenna device according to a second embodiment.

FIG. 8 illustrates the configuration of an antenna device according to a second embodiment.

In addition to the inductor (reactance element) Lb, a low pass filter LPF is provided along the sensing signal path, which is a transmission path between the antenna element 21 and the capacitance detection circuit 60. With the low pass filter LPF, a wireless communication signal supplied to the antenna element 21 or transmitted from the antenna element 21 is more strongly attenuated than in the case where only the inductor Lb is provided.

In addition, in the example illustrated in FIG. 8, the inductor L1 is shunt-connected to the wireless signal communication path in the variable matching circuit 30. The inductor L1 provides a ground potential to the capacitor Cp. Thus, the shunt-connected inductor may be part of the variable matching circuit 30.

A capacitor Cb of the low pass filter LPF is connected in parallel with the stray capacitance Ca of the antenna element 21 and therefore the capacitance detection circuit 60 detects this combined capacitance (Ca+Cp+Cb). However, since the capacitances Cp and Cb of the capacitors Cp and Cb are fixed, an amount of change of the composite capacitance (Ca+Cp+Cb) can be detected as the amount of change of the value of the stray capacitance Ca of the antenna element 21.

Third Embodiment

Figure 9:
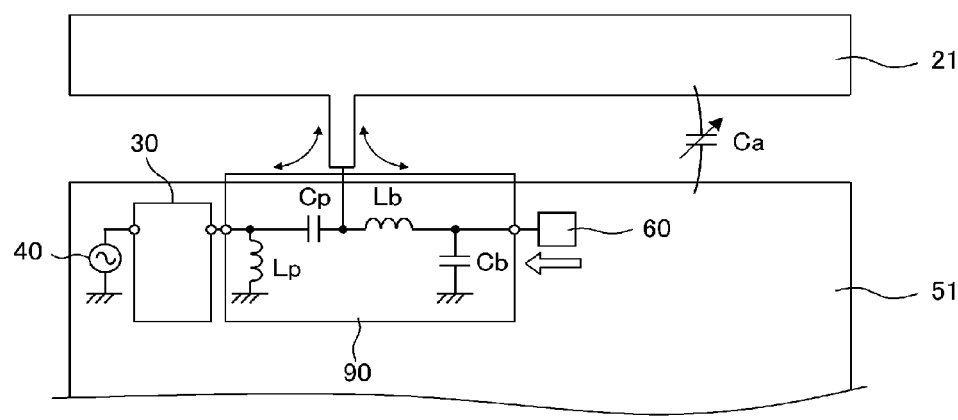
FIG. 9 illustrates the configuration of an antenna device according to a third embodiment.

FIG. 9 illustrates a configuration of an antenna device according to a third embodiment.

In FIG. 9, the inductor Lb and the capacitor Cb form a low pass filter and the capacitor Cp and an inductor Lp form a high pass filter. A diplexer 90 is formed by the low pass filter and the high pass filter. The inductor Lb of the low pass filter blocks a wireless communication signal supplied to the antenna element 21 or transmitted from the antenna element 21. The capacitor Cp of the high pass filter allows a wireless communication signal to pass therethrough and blocks a direct current. In addition, the inductor Ls provides a ground potential to the capacitor Cp. Thus, the inductor Lb and the capacitor Cp can be formed as part of the diplexer.

Fourth Embodiment

Figure 10:
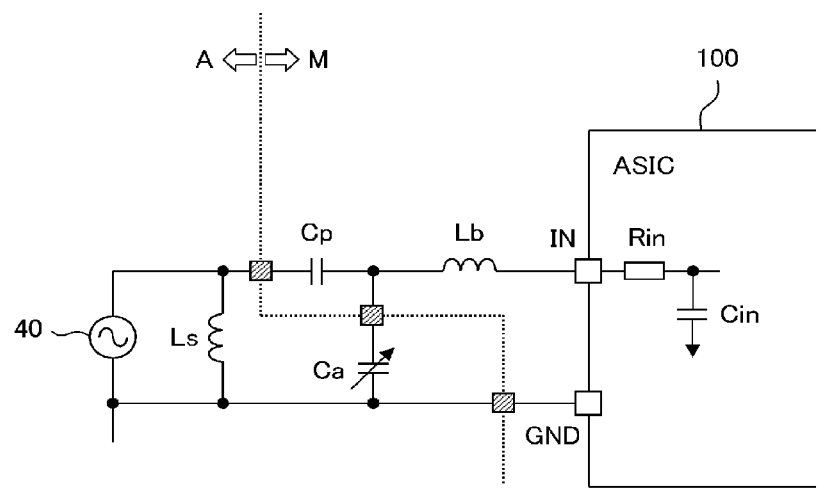
FIG. 10 illustrates a configuration of a capacitance detection circuit inside an ASIC in an antenna device of a fourth embodiment.

FIG. 10 illustrates a configuration of a capacitance detection circuit inside an ASIC in an antenna device of a fourth embodiment.

In the first embodiment, in the example illustrated in FIG. 4, the inductor Ls is provided in the ASIC-equipped module "M", but as illustrated in FIG. 10 the inductor Ls may be provided in the circuit "A" of the terminal. That is, a variable matching circuit that includes the inductor Ls may be provided in the terminal into which the ASIC equipped module "M" is incorporated.

Fifth Embodiment

Figure 11A:
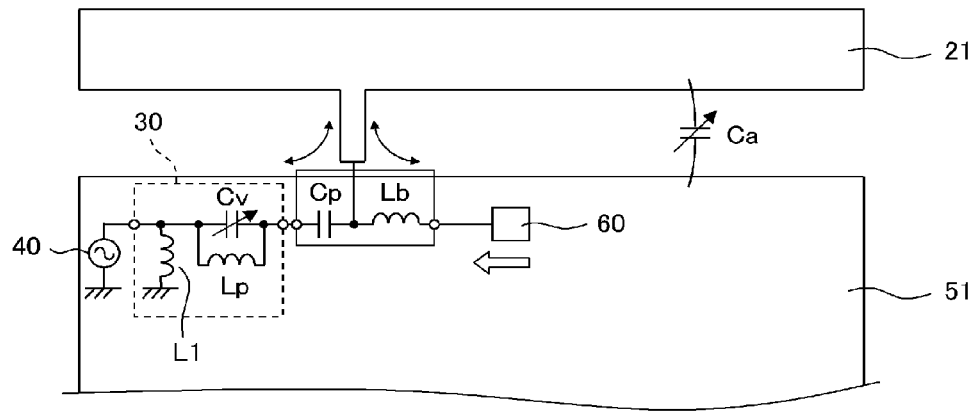
FIG. 11(A) illustrates the configuration of an antenna device according to a fifth embodiment.
Figure 11B:
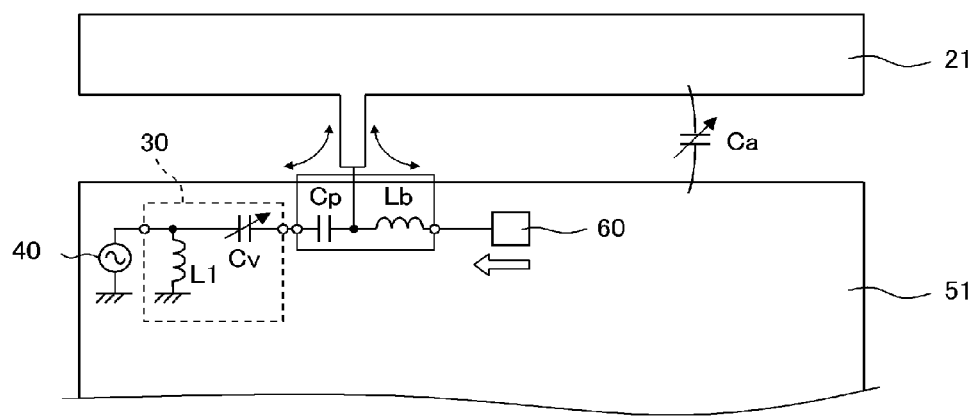
FIG. 11(B) illustrates a configuration of an antenna device according to a comparative example of the fifth embodiment.

FIG. 11(A) illustrates a configuration of an antenna device according to a fifth embodiment. FIG. 11(B) is a comparative example.

When a variable capacitance element Cv is provided directly below the antenna element 21 in the configuration of the variable matching circuit 30 in order to change the series reactance, as illustrated in FIG. 11(B), the capacitance of the stray capacitance Ca of the antenna element 21 cannot be grasped because the capacitance of the variable capacitance element Cv is not fixed. As illustrated in FIG. 11(A), the inductor Lp is connected in parallel with the variable capacitance element Cv. With this configuration, along with the inductor L1, the inductor Lp acts as a path for grounding the capacitor Cp. The inductor Lp may have a very high inductance such that it does not affect the value of the variable capacitance element Cv and may have a reactance value as part of a parallel circuit along with the variable capacitance element Cv.

Sixth Embodiment

In a sixth embodiment, selection of an antenna having good radiation Q will be described.

In short, the efficiency of an antenna device of the present disclosure depends on the radiation Q of an integrated body including the antenna element (antenna acting as a pseudo dipole including an antenna element and a ground electrode that contributes to radiation). However, the antenna element integrated body includes a load reactance that determines a resonant frequency in a desired frequency band. In addition, a capacitance detection circuit is loaded.

As the antenna element, an antenna element having the best possible radiation Q (small Q value) should be selected. Thus, the antenna efficiency and the frequency band width can be maximized under a condition of the structural space being restricted.

Here, "selection" includes of course investigating the origin of the radiation Q of the antenna and includes paying attention so that the arrangement of the sensing signal path does not adversely affect the radiation Q of the antenna.

In the sixth embodiment, this effect is experimentally investigated.

Figure 12A:
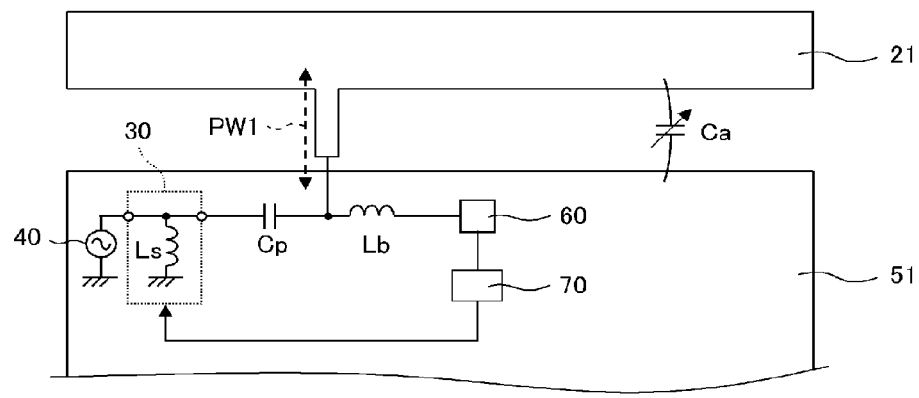
FIGS. 12(A) and 12(B) illustrate two configurations of an antenna device according to a sixth embodiment.
Figure 12B:
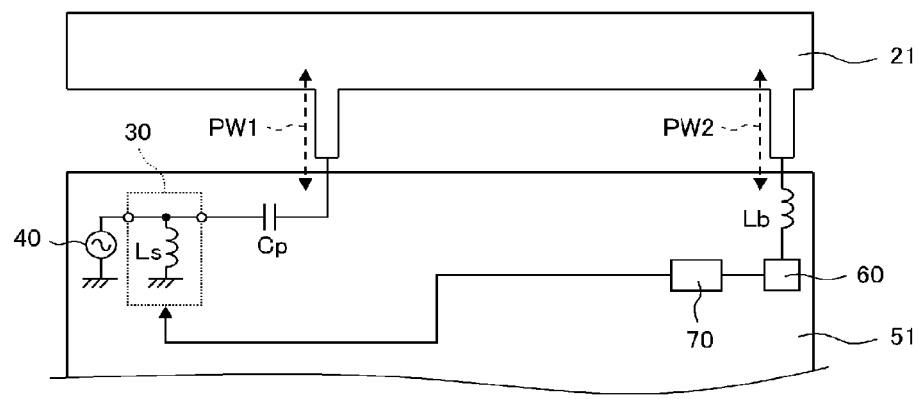
Figure 13A:
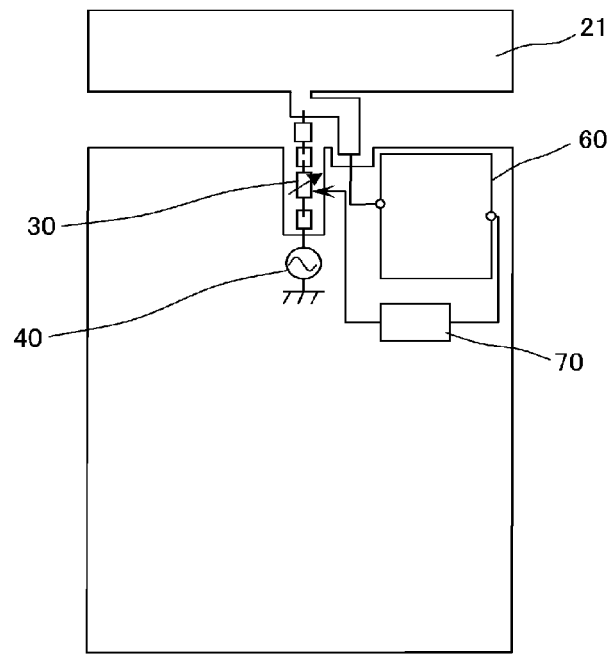
FIGS. 13(A) and 13(B) illustrate a configuration of an antenna device described in International Publication No. 2011/024506, where
Figure 13B:
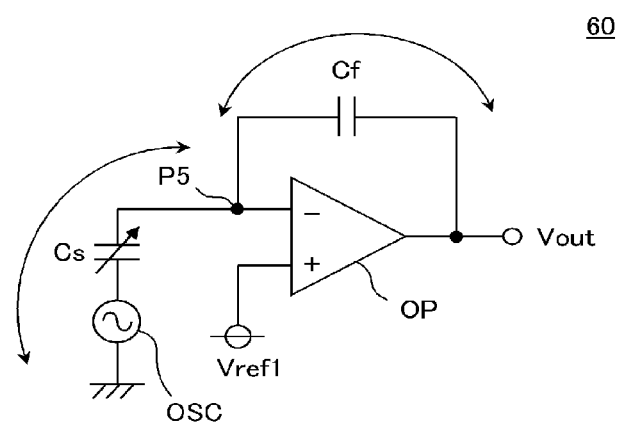

FIGS. 12(A) and 12(B) show configuration diagrams of two types of antenna device. FIG. 12(A) illustrates an antenna device that has already been described in the first embodiment. FIG. 12(B) illustrates an example in which a sensing signal path PW2 is arranged at a position that is greatly separated from a wireless communication signal path PW1.

In the arrangement illustrated in FIG. 12(B), the capacitance detection circuit 60 is an inhibitor arranged in front of the radiation toward the outside. In a pseudo-dipole structure in which the radiation Q has been optimally set, it is preferable that a configuration be adopted in which the sensing signal path PW2 be integrated with the wireless communication signal path (that is, a configuration in which the wireless communication signal path PW1 and the sensing signal path PW2 branch away from each other midway along their lengths) or that a configuration be adopted in which the wireless communication signal path PW1 and the sensing signal path PW2 are close to each other to such a degree that they can be regarded as being substantially one body when compared to wavelength.

The invention claimed is:

1. An antenna device comprising
an antenna element,
an antenna matching circuit connected between the antenna element and a feeder unit,
a capacitance detection circuit connected to the antenna element and detecting a stray capacitance of the antenna element,
a first reactance element connected to a wireless communication signal path, which is a transmission path between the antenna element and the antenna matching circuit, that allows a wireless communication signal to pass there through and that blocks a direct current, and
a second reactance element that is shunt-connected to the wireless communication signal path between the antenna matching circuit and the first reactance element to form a parallel connection of the first reactance element and the stray capacitance of the antenna element when direct current charges the first reactance element and the stray capacitance, the capacitance detection circuit including a constant current source and a timing circuit measuring a time taken to charge an antenna from the constant current source and for a voltage to reach a predetermined voltage.

2. An antenna device comprising an antenna element, an antenna matching circuit connected between the antenna element and a feeder unit, a capacitance detection circuit connected to the antenna element and detecting a stray capacitance of the antenna element, and a first reactance element connected to a wireless communication signal path, which is a transmission path between the antenna element and the antenna matching circuit, that allows a wireless communication signal to pass therethrough and that blocks a direct current, the capacitance detection circuit including a constant current source and a timing circuit measuring a time taken to charge an antenna from the constant current source and for a voltage to reach a predetermined voltage, wherein the antenna matching circuit includes a second reactance element that is shunt-connected to form a parallel connection of the first reactance element and the stray capacitance of the antenna element when direct current charges the first reactance element and the stray capacitance.

3. The antenna device according to claim 2, wherein the antenna matching circuit includes a variable capacitance element connected in series with the wireless communication signal path, and an inductor that is connected in parallel with the variable capacitance element.

4. The antenna device according to claim 1, wherein a filter circuit that blocks a wireless communication signal supplied to the antenna element or transmitted from the antenna element is provided along the transmission path between the antenna element and the capacitance detection circuit.

5. The antenna device according to claim 1, wherein the capacitance detection circuit and the feedback control circuit are formed by a single application specific integrated circuit.

6. The antenna device according to claim 1, wherein the antenna element has a good radiation in an integrated body that includes the antenna element.

7. The antenna device according to claim 6, wherein selection conditions for the plurality of types of antenna elements include a position of a feeding point for the antenna element, and a position of connection of the capacitance detection circuit to the antenna element.

\* \* \* \* \*